US009714135B2

(12) United States Patent
Kamata

(10) Patent No.: US 9,714,135 B2
(45) Date of Patent: Jul. 25, 2017

(54) CONTAINER FOR SOLAR STRING TRANSPORTATION

(71) Applicants: CLEAN ENERGY FACTORY CO., LTD., Nemuro-shi, Hokkaido (JP); MERS FORS CO., LTD., Tokyo (JP)

(72) Inventor: Hiroyuki Kamata, Tokyo (JP)

(73) Assignees: CLEAN ENERGY FACTORY CO., LTD., Nemuro-shi, Hokkaido (JP); MERS FORS CO., LTD., Tokyo (JP)

( * ) Notice: Subject to any disclaimer, the term of this patent is extended or adjusted under 35 U.S.C. 154(b) by 0 days.

(21) Appl. No.: 15/116,078

(22) PCT Filed: Apr. 22, 2015

(86) PCT No.: PCT/JP2015/062228
§ 371 (c)(1),
(2) Date: Aug. 2, 2016

(87) PCT Pub. No.: WO2015/198703
PCT Pub. Date: Dec. 30, 2015

(65) Prior Publication Data
US 2017/0137210 A1 May 18, 2017

(30) Foreign Application Priority Data
Jun. 25, 2014 (JP) ................................. 2014-130124

(51) Int. Cl.
B65D 85/68 (2006.01)
B65D 88/12 (2006.01)
(Continued)

(52) U.S. Cl.
CPC .......... B65D 85/68 (2013.01); B65D 81/107 (2013.01); B65D 88/12 (2013.01); B65D 88/546 (2013.01);
(Continued)

(58) Field of Classification Search
CPC .... B65G 49/06; B65G 49/067; B65G 49/068; B65G 49/066; B65G 49/069;
(Continued)

(56) References Cited

U.S. PATENT DOCUMENTS 4,209,917 A * 7/1980 Johnson .............. B41F 23/0443
271/189
5,018,618 A * 5/1991 Sjogren .............. B65H 29/6645
198/347.3
(Continued)

FOREIGN PATENT DOCUMENTS

JP   H05-338758 A   12/1993
JP   H08-24057 A    1/1996
(Continued)

OTHER PUBLICATIONS

PCT, "International Search Report for International Application No. PCT/JP2015/062228".

Primary Examiner — Kaitlin Joerger
(74) Attorney, Agent, or Firm — Manabu Kanesaka

(57) ABSTRACT

A container for solar string transportation includes, on the inside of a solar-string storing section, a long-side side plate, and a short-side side plate, and has an upper opening of the solar-string storing section for loading and unloading, and a pair of solar-string lifting/lowering devices along the inner wall of the long-side side plate. The solar-string lifting/lowering device includes a driving gear section set on the bottom plate side, an endless chain member that revolves around a direction changing gear section set on the upper opening side, a plurality of solar-string placing devices fixed to the endless chain member and including, on the outer side thereof, a projecting section for placing the lower surface of an end edge of the solar string, and a shock absorbing member fixed to the back of the solar-string placing devices.

(Continued)

The shock absorbing member holds the end edge upper surface of the solar string.

10 Claims, 10 Drawing Sheets

(51) Int. Cl.
*B65D 88/54* (2006.01)
*B65D 81/107* (2006.01)
*B65G 37/00* (2006.01)
*H02S 30/10* (2014.01)
*H02S 10/00* (2014.01)
*H02S 40/36* (2014.01)

(52) U.S. Cl.
CPC ............ *B65G 37/005* (2013.01); *H02S 10/00* (2013.01); *H02S 30/10* (2014.12); *H02S 40/36* (2014.12); *B65D 2585/6897* (2013.01)

(58) Field of Classification Search
CPC ............ B65G 37/005; H01L 21/67303; B65D 81/022; B65D 81/02; B65D 81/051; B65D 81/107; B65D 88/12; B65D 88/546
USPC .......... 414/327, 331.04, 795.2; 211/134–167
See application file for complete search history.

(56) References Cited

U.S. PATENT DOCUMENTS

| | | | |
|---|---|---|---|
| 6,099,230 A * | 8/2000 | Hitch | B01L 9/523 414/223.02 |
| 8,154,314 B2 * | 4/2012 | Shim | G01R 31/2893 198/347.1 |
| 9,022,717 B2 * | 5/2015 | Liu | B65G 1/14 414/331.02 |
| 9,144,901 B2 * | 9/2015 | Yang | B25H 3/00 |
| 9,187,258 B2 * | 11/2015 | Zhang | B65G 37/005 |
| 9,315,335 B2 * | 4/2016 | Bando | B65G 47/06 |
| 2004/0222177 A1 * | 11/2004 | Shai | B65G 1/127 211/121 |
| 2005/0123381 A1 * | 6/2005 | Weeden | B65G 1/14 414/305 |
| 2009/0215367 A1 * | 8/2009 | Haschke | A22C 11/008 452/51 |
| 2011/0174700 A1 * | 7/2011 | Weigl | B65G 49/067 209/552 |
| 2014/0291122 A1 * | 10/2014 | Bando | H01L 21/67706 198/602 |

FOREIGN PATENT DOCUMENTS

| | | |
|---|---|---|
| JP | H11-81680 A | 3/1999 |
| JP | 2014-31198 A | 2/2014 |

* cited by examiner

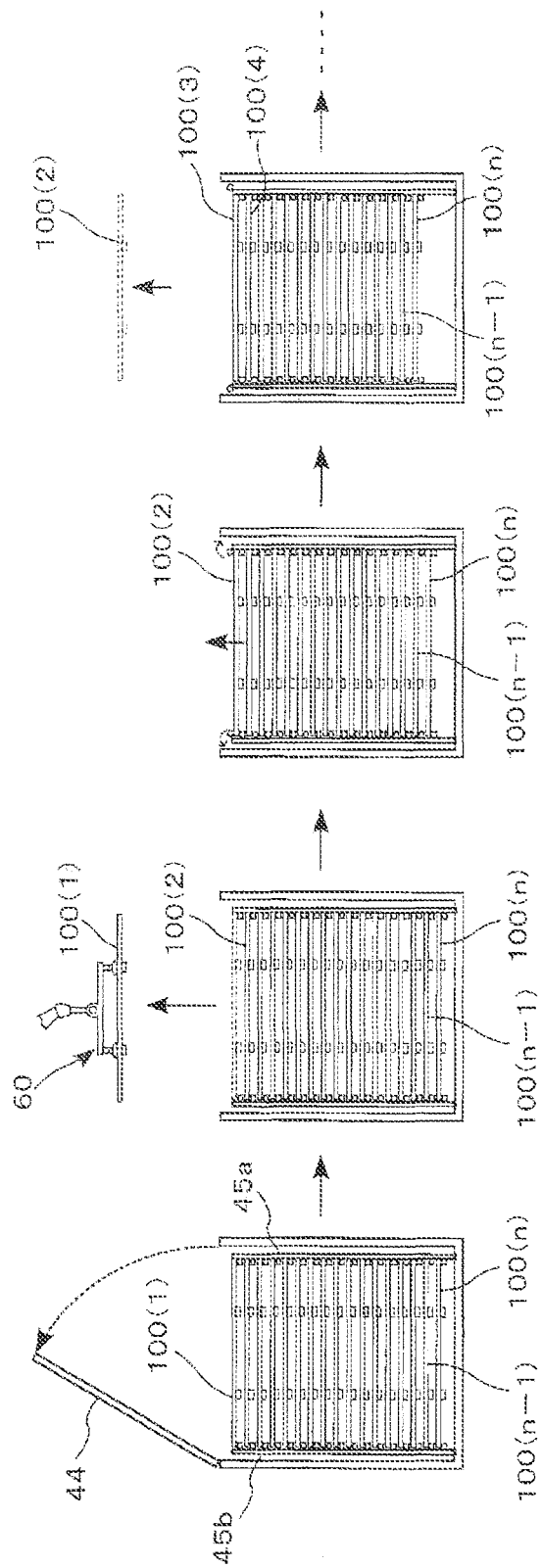

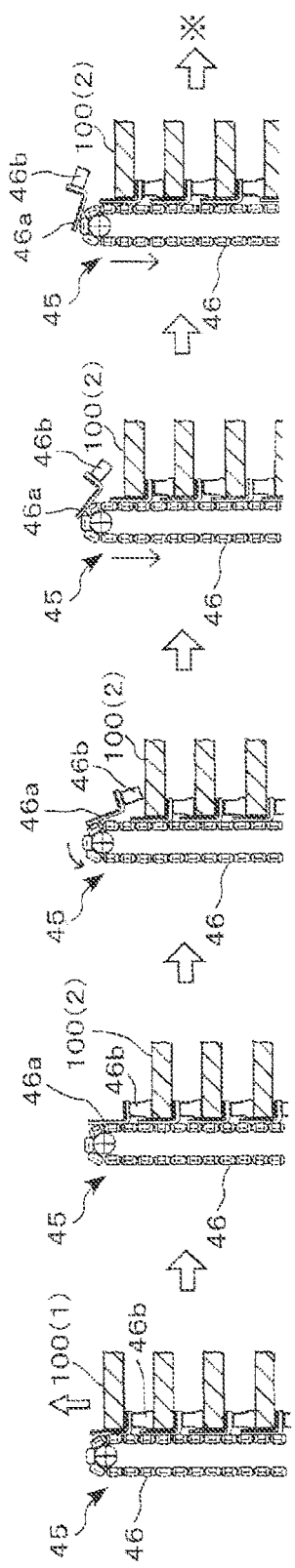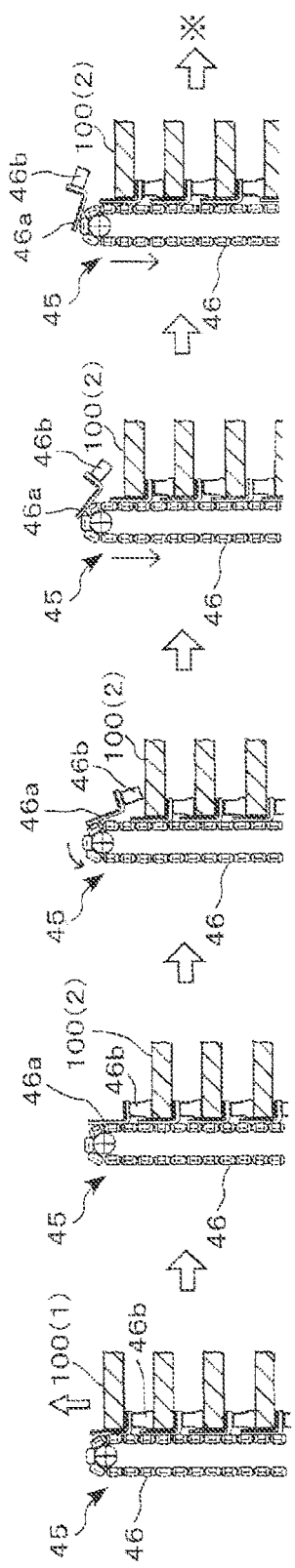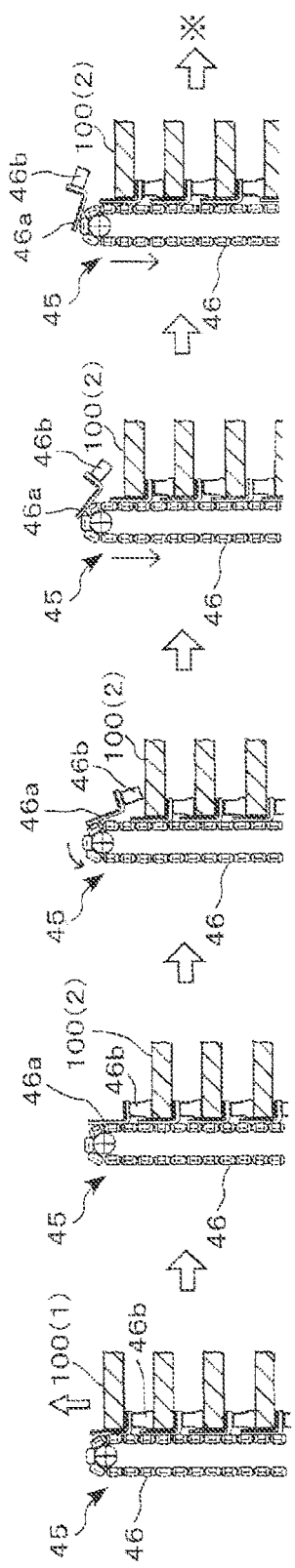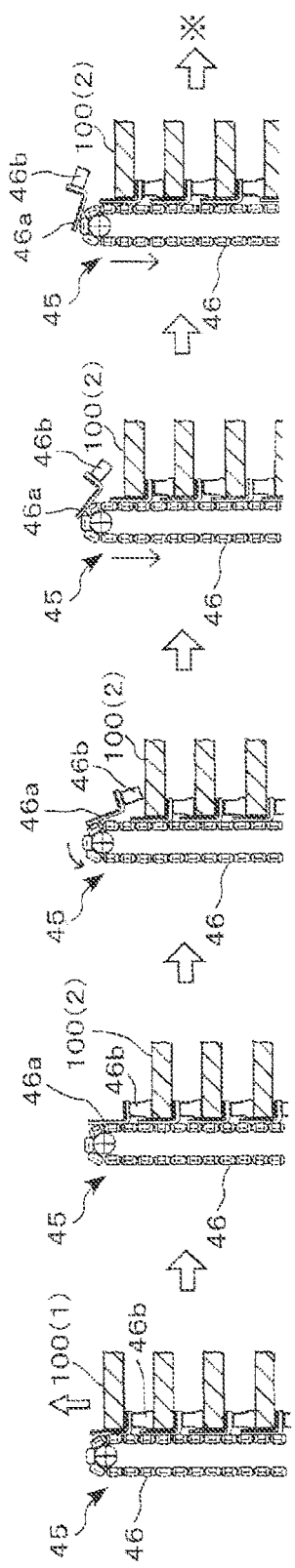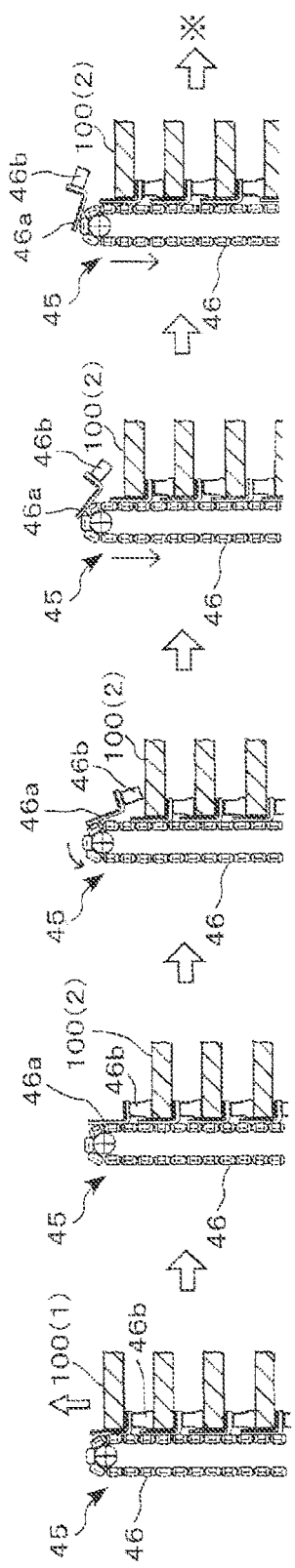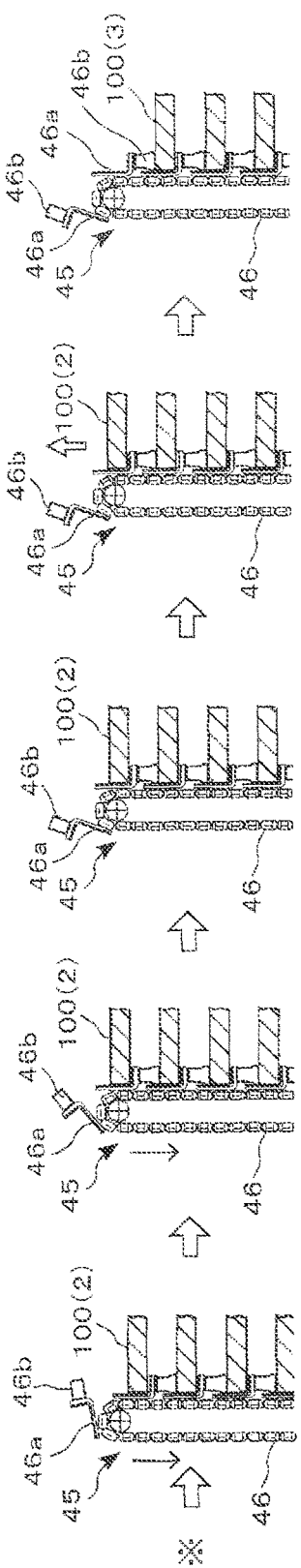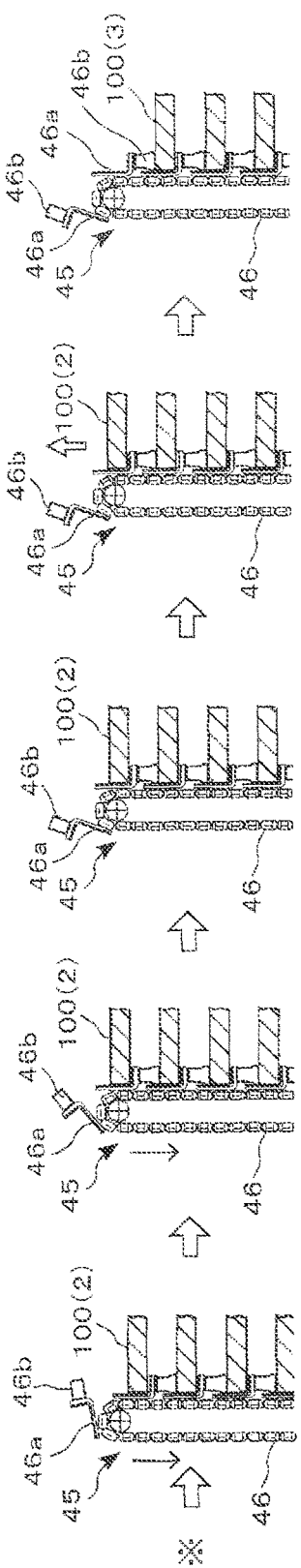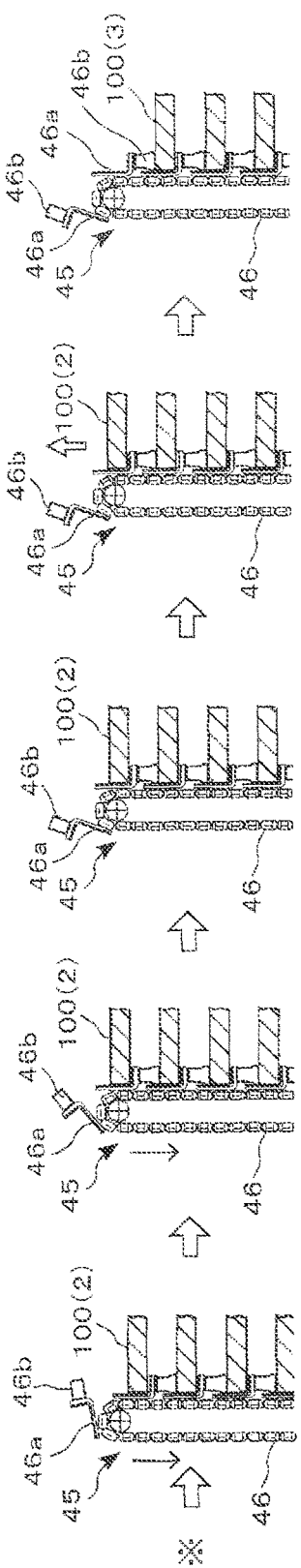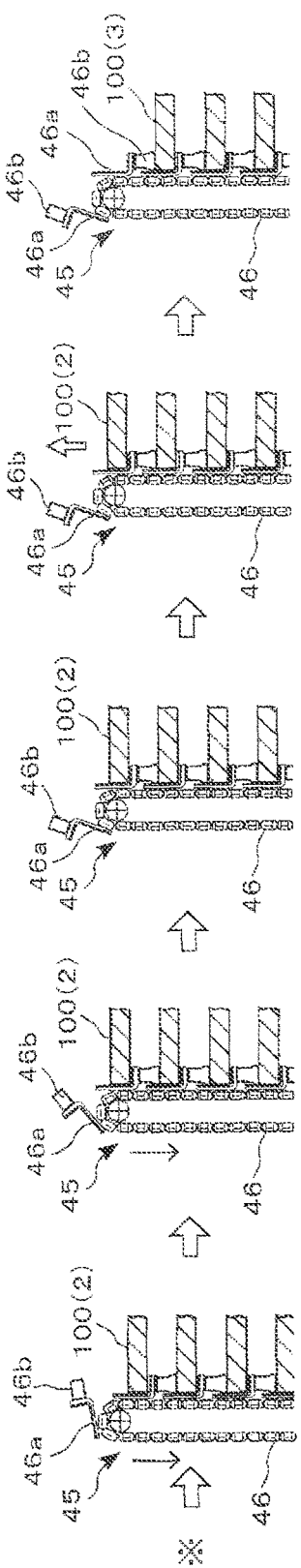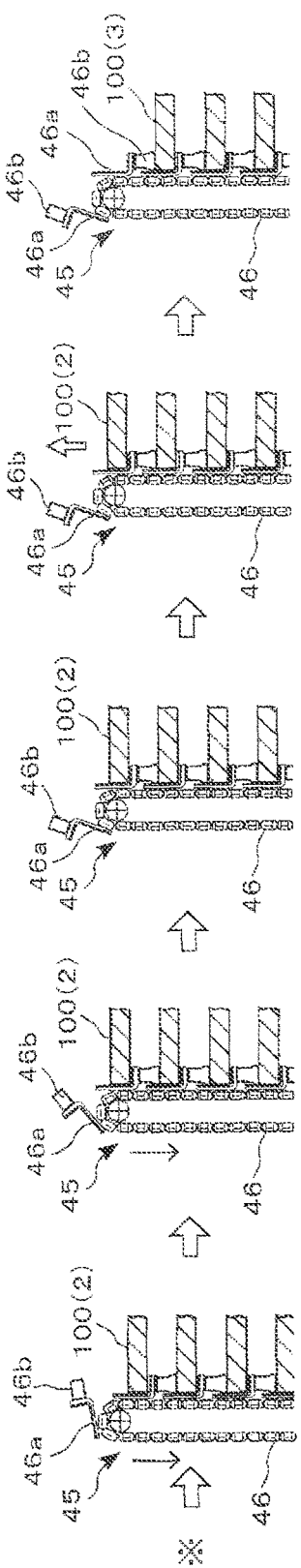

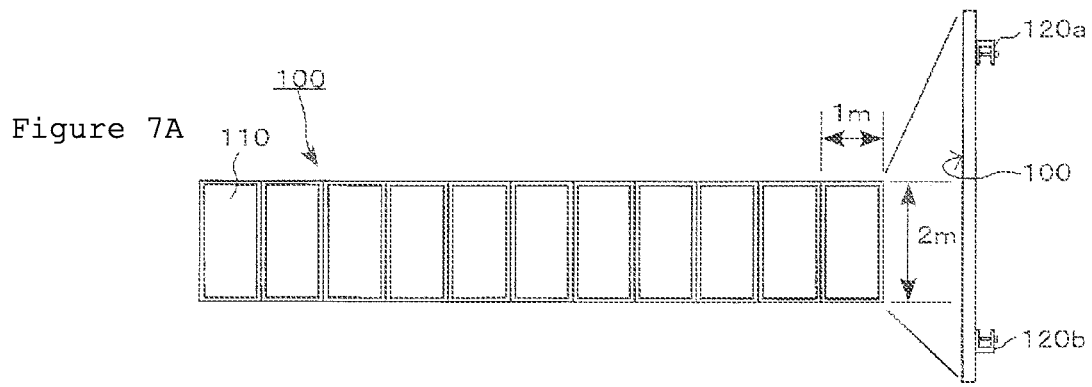
Figure 7B
Figure 7A
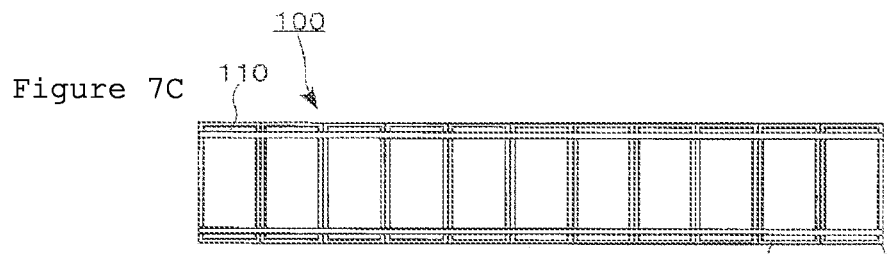
Figure 7C
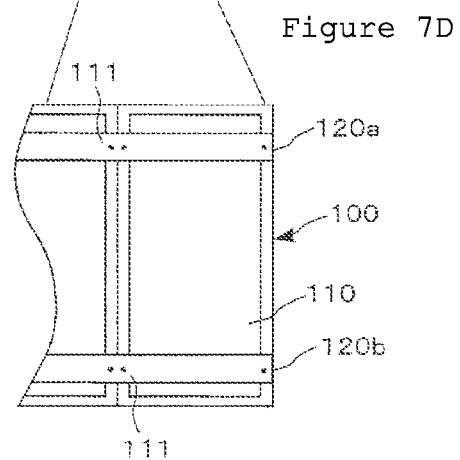
Figure 7D

CONTAINER FOR SOLAR STRING TRANSPORTATION

RELATED APPLICATIONS

The present application is National Phase of International Application No. PCT/JP2015/062228 filed Apr. 22, 2015, and claims priority from Japanese Application No. 2014-130124, filed Jun. 25, 2014, the disclosure of which is hereby incorporated by reference herein in its entirety.

TECHNICAL FIELD

The present invention relates to a container for solar string transportation for transporting solar strings, which are assembled as integrated components by arranging a large number of solar modules in series, to a site of a power generation plant (generally, a solar power plant or photovoltaic power plant), placing the solar strings on stands arrayed in a field of the power plant site, and setting the solar strings in an array shape.

BACKGROUND ART

According to the diversification of energy resources, solar power plant that makes use of sunlight has been spreading. From the beginning, a small-scale power plant set on a roof of a house has been attracting attention. However, with the lack of energy sources and suppression of emission of $CO_2$ in recent years in the background, construction of large-scale photovoltaic power plants (so-called mega solar power plants) exceeding 1000 kW has been actively performed. In the following explanation expediently, an installation location of the photovoltaic power plant is referred to as "power plant site", a location of the power plant site is referred to as "field", a unit solar panel is referred to as "solar module", several to twenty modules integrated in series and formed in a long panel shape are referred to as "solar string", and a parallel array of a larger number of "solar strings" is referred to as "solar array" as well.

In the construction of the photovoltaic power plant (solar power plant) of this type, a plurality of solar modules are integrated by parallel beams and a module supporting frame of a frame-like body as solar strings (commonly called solar panels) and the solar strings are arrayed in an array shape on stands provided in a power plant site. In general, the assembly and setting work of the solar strings is performed in the power plant site (e.g., Patent Document 1). There is also known a method of assembling the solar strings in a factory, storing the solar strings in a container, and transporting the solar strings to the power plant site (Patent Document 2).

CITATION LIST

Patent Document

Patent Document 1: JPA-1999-81680
Patent Document 2: JPA-2014-31198

SUMMARY OF INVENTION

Technical Problem

In the mega solar power plant, a large number of solar strings are arrayed in an array shape and set in the power plant site. In such a power plant site, several ten thousand to several hundred thousand solar modules are set in such a power plant site. When a roof of a general house is the power plant site, it is considered that the method of assembling and disposing the solar modules in the power plant site described in Patent Document 1 is suitable. However, in particular, in the mega solar power plant in which a large number of solar modules are set, it is not considered efficient to perform all of assembly work (assembly) of the solar modules in the power plant site, wiring work among the solar modules, and setting work for a predetermined array and fixing of the solar strings obtained by assembling the solar modules from the viewpoints of a work time for those kinds of work, safety for workers, instability of a work period affected by weather and the like, and costs.

In general, the solar strings are not assembled in a factory. The solar modules shipped from a module factory are set one by one in the power plant site. Therefore, work efficiency is not high. That is, in the method of storing the solar modules in the container or the like, transporting the solar modules to the power plant site, and attaching the solar modules to the stands provided in the field of the power plant site, carry-out of the solar strings from the container delivered to the power plant site, movement to the stands, attachment work, and cabling work are performed by human power. Therefore, a large number of workers and a long work period are required. Securing of safety of the workers is also a big problem. As a result, large expenses are required for the construction of the solar power plant (a solar power facility).

Therefore, a container used to transport solar strings assembled in a specialized factory to the power plant site is required to have not only a function for simply transporting the solar strings but also a function for obtaining satisfactory efficiency of loading of the solar strings in the assembly factory and unloading work in the power plant site and preventing damage such as breakage due to a shock and the like in the transportation from affecting the solar strings.

The container disclosed in Patent Document 2 described above includes a lifting device configured by multistage arms for placing the panels (the solar strings) to traverse on the inside, a chain member that supports the multistage arms and sequentially lifts the solar strings placed on the arms to an upper opening, which is an unloading position of the container, arm-direction changing means for retracting the arm at the top, which has unloaded the solar strings, from the upper opening, and an elastic body for sequentially moving the chain.

In the container explained above, a plurality of solar strings are sequentially loaded and stored in a state in which the solar strings are respectively placed on the multistage arms. The container is placed on a container truck (a trailer truck) and transported to the power plant site. In the power plant site, the solar string at the top of the multistage arms is hoisted and unloaded by a crane and disposed on a predetermined stand (a solar string setting stand).

The arms provided in the container support the bottom surfaces of the solar strings in a direction perpendicular to the longitudinal direction of the solar strings, stand upward after the solar strings are unloaded, and turn and retract to the outside of a range of an unloading work region for the solar strings. In the lifting device, complicated arm direction changing means for the standing and the turning of the arms is provided. A work space for changing an arm direction is secured wide. The lifting device includes a tension spring of a coil spring at one end of the chain member and includes a complicated loading and unloading mechanism that lowers (during loading) and lifts (during unloading), with the tension spring, the chain member according to an increase and a decrease in the weight of one solar string to adopt a first-in last-out system.

An object of the present invention is to provide a container for solar string transportation suitable for a solar power plant construction method that enables a short work period, securing of safety of work, low costs, and avoidance of damage to solar strings in a transportation process.

Solution to Problem

In order to achieve the object, the present invention is structured to be capable of facilitating loading and unloading work of solar strings in a container for solar string transportation and limiting a work space of the work to a minimum necessary region. A configuration example of the present invention is described below.

(1) A container for solar string transportation for transporting solar strings assembled as integrated components (units) by fixing a plurality of solar modules to a supporting frame, the container including a solar-string storing section formed by a bottom plate formed in a rectangular shape in plan view, a pair of long-side side plates planted and attached at longitudinal side both end edges of the bottom plate, and a pair of short-side side plates planted and attached at lateral side both end edges of the bottom plate, an upper opening formed by the pair of long-side side plates and the pair of short-side side plates being formed as an opened section for loading and unloading of the solar strings, wherein on the inside of the solar-string storing section, rows of pairs of solar-string lifting/lowering means set along the inner walls of the pair of long-side side plates and arrayed at a predetermined interval are provided, the solar-string lifting/lowering means includes a driving gear section driven by a driving section set on the bottom plate side, an endless chain member laid over to revolve around a direction changing gear section set on the upper opening side irreversibly and in synchronization with the rows of the pair of solar-string lifting/lowering means, a plurality of solar-string placing means fixed to the endless chain member at a predetermined interval and including, on the outer side of a track of the revolution, a projecting section for placing the lower surface of an end edge of the solar string, and a shock absorbing member fixed to the back of the solar-string placing means, the shock absorbing member pressing and holding the end edge upper surface of the solar string placed under the solar-string placing means, and during the loading and the unloading, the solar-string placing means located at the top of the solar-string lifting/lowering means and emptied without the solar string placed thereon and the shock absorbing member are controlled to move to retract to between the solar-string lifting/lowering means and the long-side side plate by the revolving movement of the chain member.

(2) A container for solar string transportation for transporting solar strings assembled as integrated components (units) by fixing a plurality of solar modules to a supporting frame, the container including a solar-string storing section formed by a bottom plate formed in a rectangular shape in plan view, a pair of long-side side plates planted and attached at longitudinal side both end edges of the bottom plate, and a pair of short-side side plates planted and attached at lateral side both end edges of the bottom plate, an upper opening formed by the pair of long-side side plates and the pair of short-side side plates being formed as an opened section for loading and unloading of the solar strings, wherein on the inside of the solar-string storing section, rows of pairs of solar-string lifting/lowering means set along the inner walls of the pair of long-side side plates and arrayed at a predetermined interval are provided, the solar-string lifting/lowering means includes a driving gear section driven by a driving section set on the bottom plate side, an endless chain member laid over to revolve around a direction changing gear section set on the upper opening side irreversibly and in synchronization with the rows of the pair of solar-string lifting/lowering means, a plurality of solar-string placing means fixed to the endless chain member at a predetermined interval and including, on the outer side of a track of the revolution, a projecting section for placing the lower surface of an end edge of the solar string, and a shock absorbing member fixed to the back of the solar-string placing means, the shock absorbing member pressing and holding the end edge upper surface of the solar string placed under the solar-string placing means, a driving shaft that transmits a driving force from the driving section to the driving gear section and a supporting shaft that supports the direction changing gear sections to rotate are respectively provided in common in the driving gear sections and the direction changing gear sections of a plurality of the solar-string lifting/lowering means set at the predetermined interval along the inner walls of the pair of long-side side plates of the container, and during the loading and the unloading, the solar-string placing means located at the top of the solar-string lifting/lowering means and emptied without the solar string placed thereon and the shock absorbing member are controlled to move to retract to between the solar-string lifting/lowering means and the long-side side plate by the revolving movement of the chain member.

(3) In (2) described above, the solar-string placing means is a single member obtained by bridging the solar-string placing means of the plurality of solar-string lifting/lowering means in common at the same height.

(4) In (2) described above, the shock absorbing member is a single member obtained by bridging the solar-string placing means of the plurality of solar-string lifting/lowering means in common at the same height.

(5) In (2) described above, the solar-string placing means is a single member obtained by bridging the solar-string placing means, which form the rows of the plurality of solar-string lifting/lowering means, in common at the same height, and the shock absorbing member is individually provided in each of the solar-string placing means of the plurality of solar-string lifting/lowering means.

(6) In (1) described above, the driving section of the solar-string lifting/lowering means uses an electric motor as a driving source.

(7) In (1) described above, the driving section of the solar-string lifting/lowering means uses hydraulic pressure as a driving source.

(8) In (1) described above, the driving section of the solar-string lifting/lowering means uses air pressure as a driving source.

(9) In (1) described above, the container includes lifting/lowering-means-row moving/fixing means for changing and fixing, according to a size of the solar strings to be loaded, an interval between one row and the other row of the rows of the pair of solar-string lifting/lowering means set along the inner walls of the pair of long-side side plates.

(10) In (9) described above, the lifting/lowering-means-row moving/fixing means is set to move only the one row of the rows of the pair of solar-string lifting/lowering means.

It goes without saying that the present invention can be variously changed without departing from the configurations explained above and the technical idea described in the detailed explanation of the invention below.

Advantageous Effects of Invention

The container for solar string transportation according to the present invention is a special container used to, in an assembly factory, fix a plurality of solar strings to a supporting frame and transport the solar strings applied with incidental work such as inter-solar-module wiring to a power plant site. By adopting the typical configuration example explained above, the container for solar string transportation according to the present invention enables loading in the assembly factory, unloading in the power plant site, and solar string array setting work to be executed at high efficiency and contributes to a reduction in costs of power plant site construction.

Time for work for unloading, using a dedicated heavy machine, a large number of solar strings carried into the power plant site by the container for solar string transportation and fixing the solar strings to a large number of stands (fixing stands for the solar strings) provided in a field (a location of the power plant site) is as explained below according to a site simulation. For example, concerning a solar string having sizes of approximately 2 m×11 m obtained by using eleven solar modules having respective lateral and longitudinal sizes of approximately 1 m×2 m, when one dedicated crane operator (also working as a driver of the heavy machine) and four people for the fixing work to the stands are disposed as human resources working in the power plant site, time for fixing one solar string to the stand is approximately 2.5 minutes.

In the construction of the mega (large scale) solar power plant, it is possible to greatly reduce a work time even if the number of solar strings included in a service range of arms configuring a crane of a heavy machine dedicated for the power plant site construction and time required for movement of the heavy machine dedicated for the power plant site construction and measurement of the distance to the stands are taken into account. As a result, it is possible to greatly reduce construction costs of the mega solar power plant.

BRIEF DESCRIPTION OF THE DRAWINGS

FIGS. 5A, 5B, 5C, and 5D are explanatory diagrams of work for unloading solar strings from the container for solar string transportation in a power plant site.

FIGS. 6A, 6B, 6C, 6D, 6E, 6F, 6G, 6H, 6I, and 6J are schematic diagrams for explaining, in time series, unloading work of the solar-string lifting/lowering means provided in the container for solar string transportation.

FIGS. 7A, 7B, 7C, and 7D are schematic diagrams for explaining an example of solar strings handled by the container for solar string transportation of the present invention.

DESCRIPTION OF EMBODIMENTS

Modes for carrying out the present invention are explained in detail below with reference to the drawings of embodiments.

First Embodiment

Figure 1:
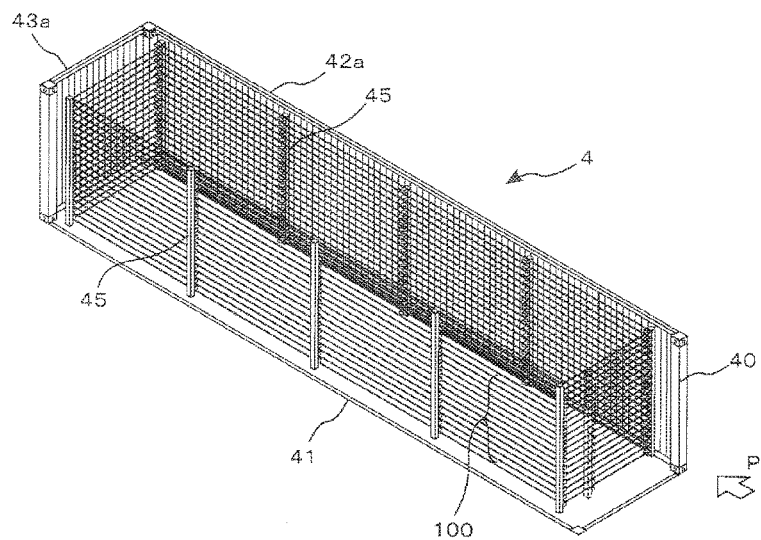
FIG. 1 is a perspective view for explaining the schematic configuration of a container for solar string transportation according to the present invention.
Figure 2:
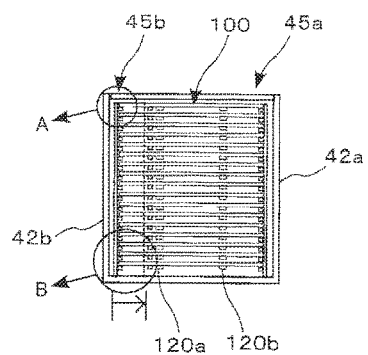
FIG. 2 is a side view of FIG. 1 viewed from an arrow P direction.
Figure 3:
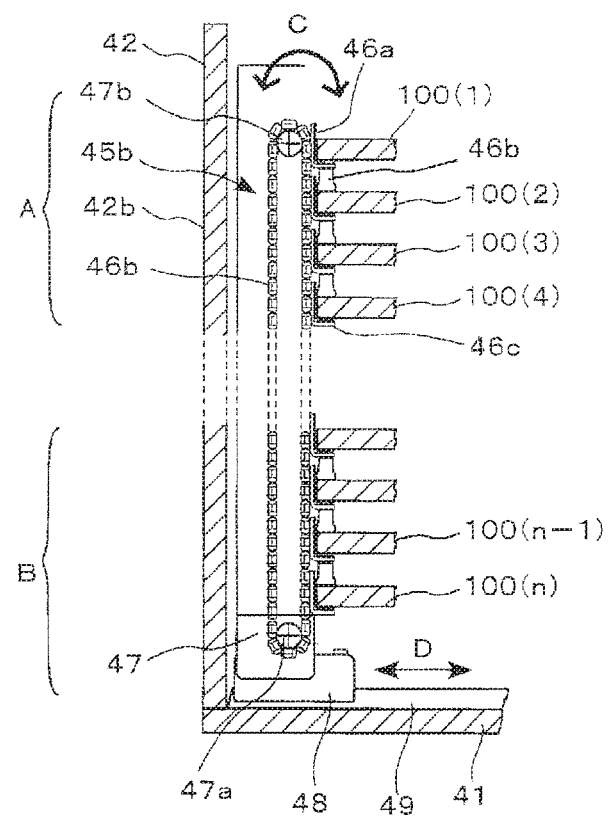
FIG. 3 is a schematic diagram of solar-string lifting/lowering means for explaining a first embodiment of the container for solar string transportation according to the present invention and enlarging and showing a portion indicated by A and a portion indicated by B in FIG. 2.
Figure 4:
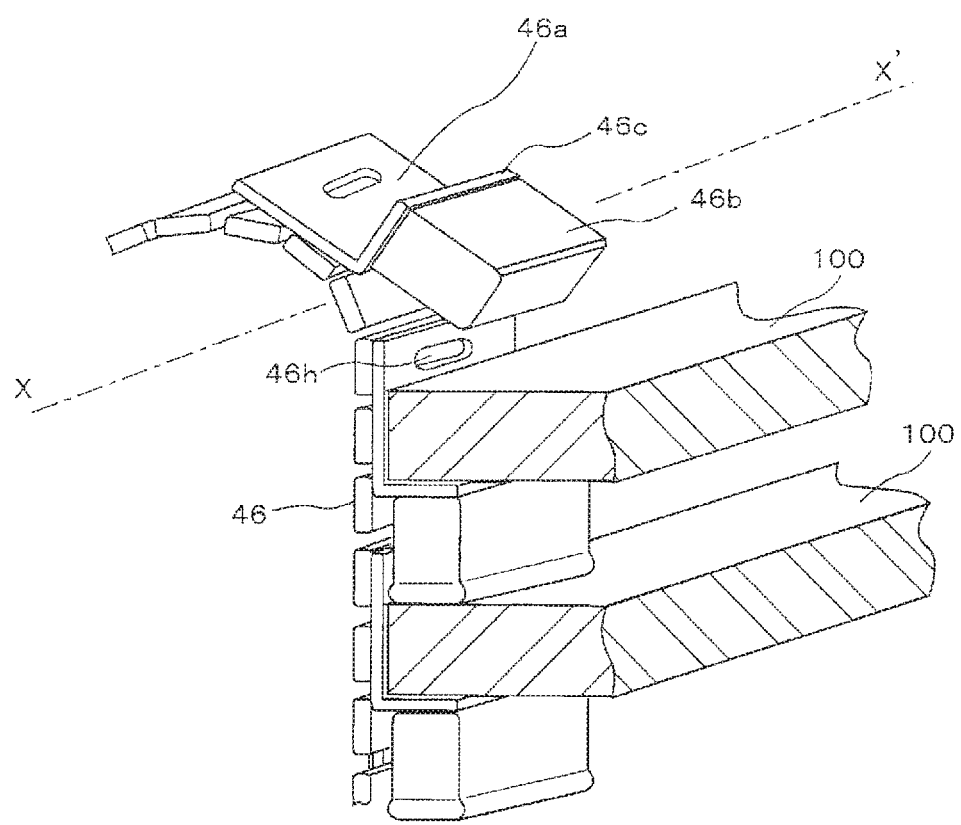
FIG. 4 is a main part enlarged view of the solar-string lifting/lowering means shown in FIG. 3.

FIG. 1 is a perspective view for explaining the schematic configuration of a container for solar string transportation according to the present invention. FIG. 2 is a side view of FIG. 1 viewed from an arrow P direction. FIG. 3 is a schematic diagram of solar-string lifting/lowering means enlarging and showing a portion indicated by A and a portion indicated by B in FIG. 2. FIG. 4 is a main part enlarged view of the solar-string lifting/lowering means shown in FIG. 3.

A container for solar string transportation 4 according to the present invention shown in FIG. 1 is formed by a bottom plate 41 formed in a rectangular shape in plan view, a pair of long-side side plates 42 (42a, 42b) held by column bodies 40, which are provided at the corners of the bottom plate 41, and planted and attached at longitudinal side both end edges of the bottom plate 41, and a pair of short-side side plates 43 (43a, 43b; 43b is not shown in the figure) planted and attached at lateral side both end edges of the bottom plate 41. The container for solar string transportation 4 includes a solar-string storing section in which an upper opening formed by the pair of long-side side plates 42 (42a, 42b) and the pair of short-side side plates 43 (43a, 43b) is formed as an opened section for loading and unloading solar strings. Note that, in the upper opening, a lid 44 (see FIGS. 5A, 5B, 5C, and 5D) that turns to any one side of the pair of long-side side plates 42 (42a, 42b) and opens the upper opening is provided. The lid 44 may be configured to be detached from the upper opening.

On the inside of the solar-string storing section, rows (45a, 45b) of solar-string lifting/lowering means 45 arrayed respectively along the inner walls of the pair of long-side side plates 42 (42a, 42b) and at a predetermined interval and set to be opposed to each other in the width direction of the bottom plate 41 are provided. The solar-string lifting/lowering means 45 (45a, 45b) includes a driving gear section 47a driven by a driving section 47 set on the bottom plate 41 side and an endless chain member 46 set on the upper opening side and laid over to revolve around a direction changing gear section 47b.

The endless chain member 46 includes, on the outer side of a track of the revolution, a plurality of solar-string placing means 46a fixed to the endless chain member 46 at a predetermined interval and including a projecting section 46c for placing the lower surface of the end edge of the solar string and a shock absorbing member 46b fixed to the back of the projecting section 46c of the solar-string placing means 46a, the shock absorbing member 46b pressing and holding the end edge upper surface of a solar string 100 placed under the solar-string placing means 46a. In this embodiment, the solar-string placing means 46a is formed of an iron material including steel, an aluminum material, or another metal material. The shock absorbing member 46b is formed of an elastic material such as a rubber material or synthetic resin. The solar-string placing means 46a is fixed to an endless chain by welding or the like. The shock absorbing member 46b is fixed to the back (the rear surface) of the solar-string placing means 46a by an appropriate adhesive.

During the loading and the unloading, the solar-string placing means 46a located at the top of the solar-string lifting/lowering means 45 and emptied without the solar string 100 placed thereon and the shock absorbing member 46b are controlled to move to retract to between the solar-string lifting/lowering means 45 (45b) and the long-side side plate 42 (42b in FIG. 3) by the revolving movement of the chain member 46 not to hinder unloading of the next solar string 100 as shown in FIG. 4. In FIG. 4, reference sign 46h denotes a perforation provided in the chain member 46. The perforation 46h meshes with sprockets of the driving gear 47a and the direction changing gear 47b. Line X-X' in FIG. 4 indicates a direction of a rotation axis of the direction changing gear 47b.

The driving section 47 of the solar-string lifting/lowering means 45 can use an electric motor, hydraulic pressure, or air pressure as a driving source. The driving section 47 desirably couples driving gears of one same row with a common shaft, couples driving gear of the other same row with a common shaft, and drives the other driving gears in synchronization with the one driving gears.

The container 4 includes lifting/lowering-means-row moving/fixing means 48 for changing and fixing, according to a size of solar strings to be loaded, an interval between one row 45a and the other row 45b of the rows of the pair of solar-string lifting/lowering means 45 (45a, 45b) set along the inner walls of the pair of long-side side plates 42 (42a, 42b). The lifting/lowering-means-row moving/fixing means 48 is set to move only one (45b) of the rows of the pair of solar-string lifting/lowering means on a rail 49. A moving distance of an arrow D in FIG. 3 is set to correspond to the width of a solar string to be transported.

FIGS. 5A, 5B, 5C, and 5D are explanatory diagrams of work for unloading solar strings from the container for solar string transportation in a power plant site. FIGS. 6A, 6B, 6C, 6D, 6E, 6F, 6G, 6H, 6I, and 6J are schematic diagrams for explaining, in time series, unloading work of the solar-string lifting/lowering means provided in the container for solar string transportation. In FIGS. 5A, 5B, 5C, and 5D, in the container for solar string transportation arrived in the power plant site and transferred to a specially rigged heavy machine (a heavy machine for power plant site construction), the lid 44 is opened to expose the upper opening (A). The lid 44 is held side by side with the side plate or removed from the container.

A solar string 100(1) stacked at the top of the upper opening is hoisted by vacuum suction means 60 attached to a head of a not-shown crane dedicated for solar strings and is disposed on a predetermined stand (B). The next solar string 100(2) is lifted to the top of the upper opening by the solar-string lifting/lowering means (C). The solar string 100(2) is hoisted by the vacuum suction means 60 and disposed on a predetermined stand (D). Thereafter, this is sequentially repeated to a solar string 100(*n*) to perform unloading and disposition on stands of all the solar strings.

A solar string lifting/lowering operation in unloading work of the solar string 100 is explained with reference to FIGS. 6A, 6B, 6C, 6D, 6E, 6F, 6G, 6H, 6I, and 6J. As shown in FIG. 6A, the solar string 100(1) at the top in a state of FIG. 5A is hoisted and unloaded as shown in FIG. 5B. A state of the hoisting and the unloading is shown in FIG. 6B. Hoisting of the solar string 100(1) from the endless chain 46 is detected by a not-shown sensor or the endless chain 46 starts revolution in a direction of a thin arrow according to check by a crane operator and operation of a control system (FIG. 6C).

The endless chain 46 further revolves in the same direction and stops at a point in time when the next solar string 100(2) rises to the top position of the opening (FIG. 6D ⇒ FIG. 6E ⇒ FIG. 6F ⇒ FIG. 6G ⇒ FIG. 6H). The solar-string placing means 46a and the shock absorbing member 46b change to a state in which the solar-string placing means 46a and the shock absorbing member 46b retract to a position not hindering the unloading of the solar string 100. The solar string 100(2) is hoisted by the vacuum suction means 60 (FIG. 6I). After the solar string 100(2) is unloaded (FIG. 6J), the endless chain 46 repeats a revolving operation indicated by FIG. 6D ⇒ FIG. 6E ⇒ FIG. 6F ⇒ FIG. 6G ⇒ FIG. 6H from FIG. 6C. This operation is repeated a necessary number of times to dispose the solar strings on the stands.

FIGS. 7A, 7B, 7C, and 7D are schematic diagrams for explaining an example of a solar string handled by the container for solar string transportation of the present invention. FIG. 7A is a plan view of a front surface for receiving sunlight, FIG. 7B is a side view of a short side of FIG. 7A, FIG. 7C is a plan view of a rear surface fixed to a stand, and FIG. 7D is a main part enlarged view of FIG. 7C. The solar string 100 is configured as one solar string by fixing eleven solar modules 110 having sizes of 1 m×2 m to two supporting frames 120a, 120b with long-side sides of the solar modules 110 set adjacent to one another. In this configuration example, the supporting frames 120a, 120b are fixed to edge materials of the solar modules 110 by bolts and nuts 111. However, other known fixing means can also be used.

Figure 8:
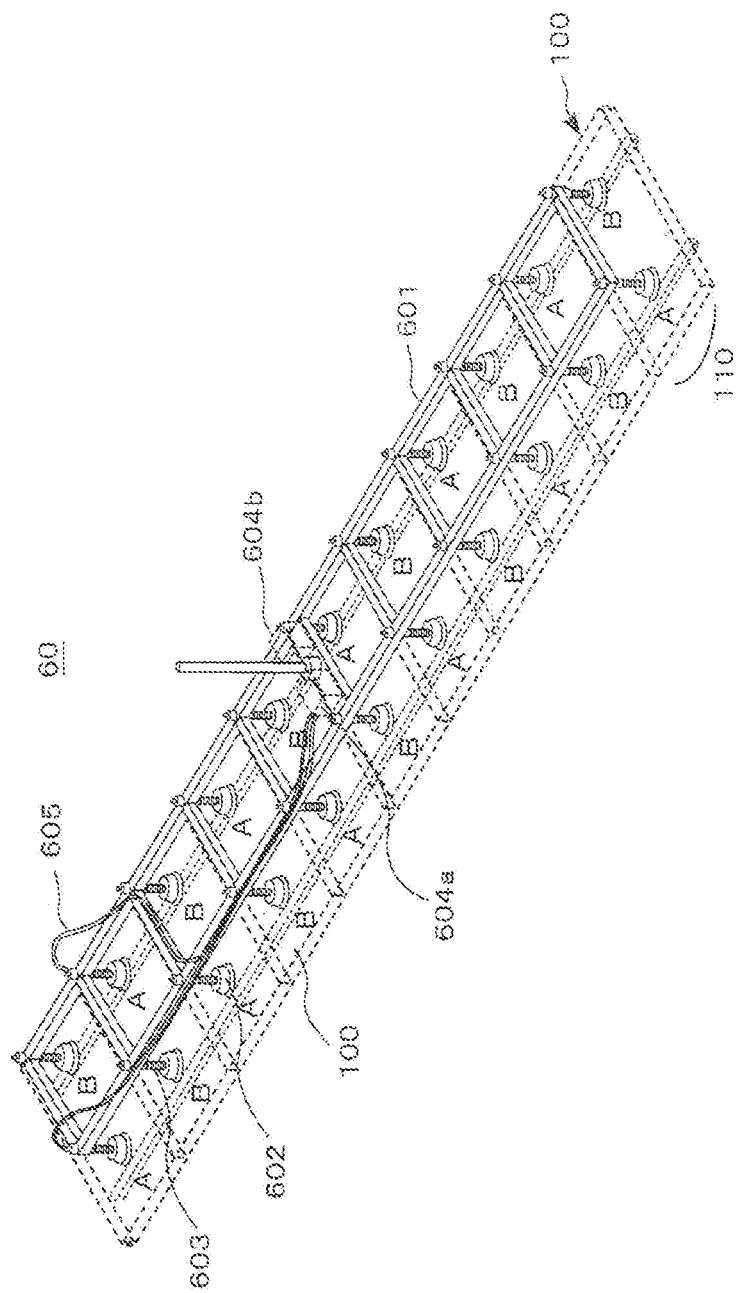
FIG. 8 is a perspective view for explaining a configuration example of vacuum suction means shown in FIGS. 5A, 5B, 5C, and 5D.
Figure 9:
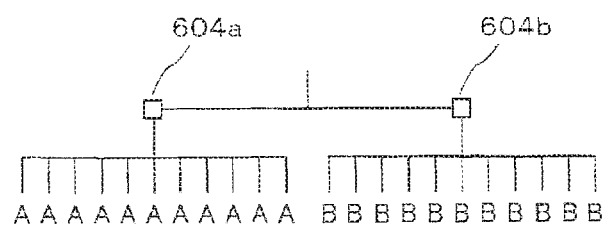
FIG. 9 is an explanatory diagram of disposition of a vacuum suction pad.

FIG. 8 is a perspective view for explaining a configuration example of the vacuum suction means explained with reference to FIGS. 5A, 5B, 5C, and 5D. FIG. 9 is an explanatory diagram of vacuum suction pads. The vacuum suction means 60 includes a large number of vacuum suction pads 602 on the lower side of a frame body 601 having a ladder shape. The vacuum suction pads 602 are attached to the frame body by spring plungers 603. As shown in FIG. 8, the vacuum suction pads 602 are disposed in each of the solar modules 110 as a pair of A and B and connected to, by pipes 605, vacuum pumps 604a, 604b mounted in the center portion of the frame body 601.

Only two pipes 605 are shown. The pair of vacuum suction pads of A and B is alternately disposed along the longitudinal direction of the solar string 100 as shown in FIG. 8. The vacuum suction pads are alternately disposed (zigzag) in the width direction (the lateral direction) and the longitudinal direction of the solar string 100 and the vacuum suction pads of A and B are respectively driven by independent vacuum systems to obtain vacuum suction disposition of two systems of an A system and a B system disposed zigzag. Consequently, even if a deficiency of suction occurs in any one of the suction pads in unloading, it is possible to prevent the solar string 100 from immediately dropping.

Figure 10:
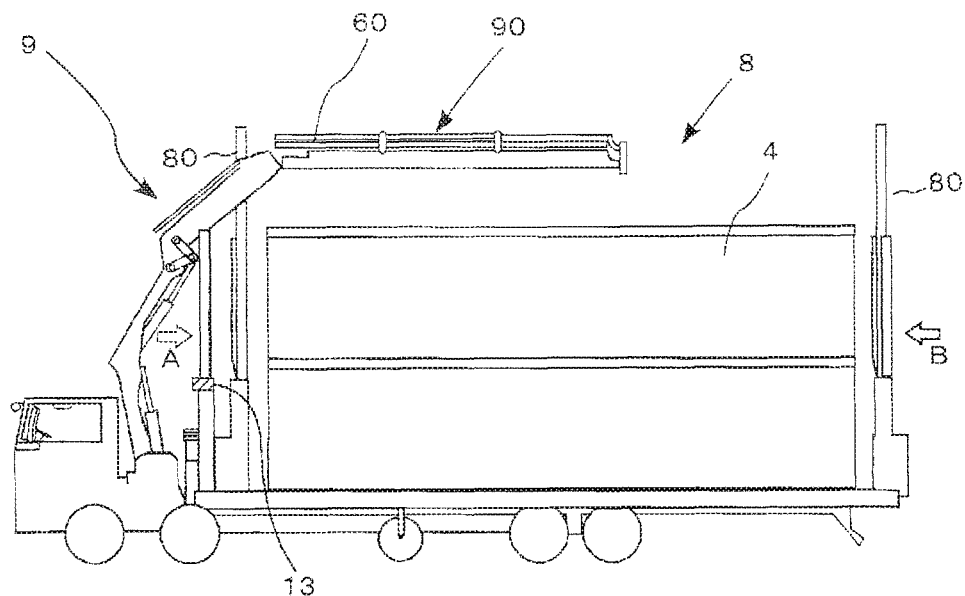
FIG. 10 is an explanatory diagram of a heavy machine dedicated for power plant site construction for work in the power plant site.

FIG. 10 is an explanatory diagram of a heavy machine dedicated for power plant site construction for work in a power plant site. In a heavy machine dedicated for power plant site construction 8, a container transfer apparatus 80 and a dedicated crane 9 are set. The dedicated crane 9 is a multi-axis crane. The multi-axis crane in this embodiment is a multi-joint arm crane configured from four arms 90 (90a, 90b, 90c, 90d). The vacuum suction means (a vacuum gripper) 60 explained with reference to FIG. 8 is provided in the crane 9. In FIG. 10, an arm of the vacuum suction means 60 is shown in a folded state. The container dedicated for solar strings 4 carried into the container power plant site is hoisted by the container transfer apparatus 80 and transferred to the heavy machine dedicated for power plant site construction 8.

The dedicated container 4 transferred to the heavy machine dedicated for power plant site construction 8 is hoisted from a chassis of the heavy machine to a work position and fixed. In that state, the dedicated container 4 moves to an initial work position (a start position: a 0 position) of a field of the power plant site. The solar modules are unloaded in the procedure explained with reference to FIGS. 5A, 5B, 5C, and 5D and FIGS. 6A, 6B, 6C, 6D, 6E, 6F, 6G, 6H, 6I, and 6J using the multi-joint arm crane and distributedly disposed on a large number of stands set in a not-shown field by extension and retraction and turning of a multi-joint arm. The positions of the stands on which the solar strings should be disposed are checked using laser ranging means 13 or the like provided in a vehicle body of the heavy machine dedicated for power plant site construction 8 and stored in a memory of a control device of the dedicated crane as ranging data. The dedicated crane 9 extends and retracts the arms 90 (90a, 90b, 90c, 90d) according to the ranging data and turns to dispose the solar string 100 on a predetermined stand.

According to this embodiment, it is possible to reduce a work period with a small number of workers and secure safety of work and obtain a container for solar string transportation for solar power plant construction that can be set at low costs.

Second Embodiment

Figure 11:
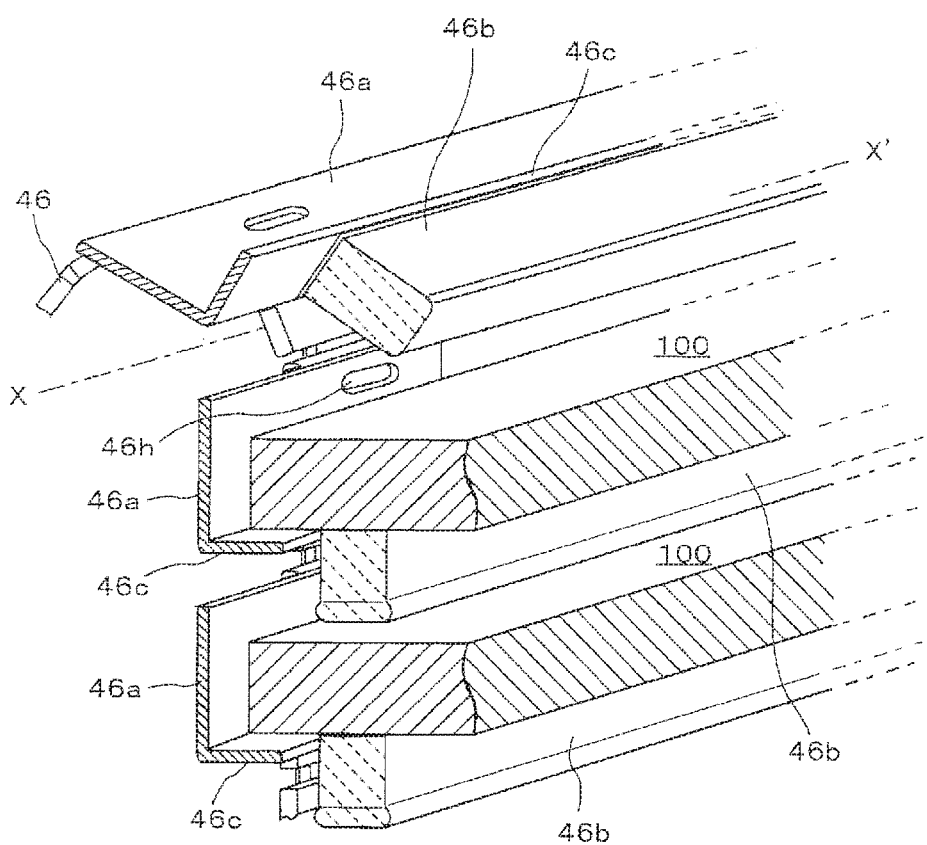
FIG. 11 is a main part enlarged view of solar-string lifting/lowering means for explaining a second embodiment of the container for solar string transportation according to the present invention.
Figure 12:
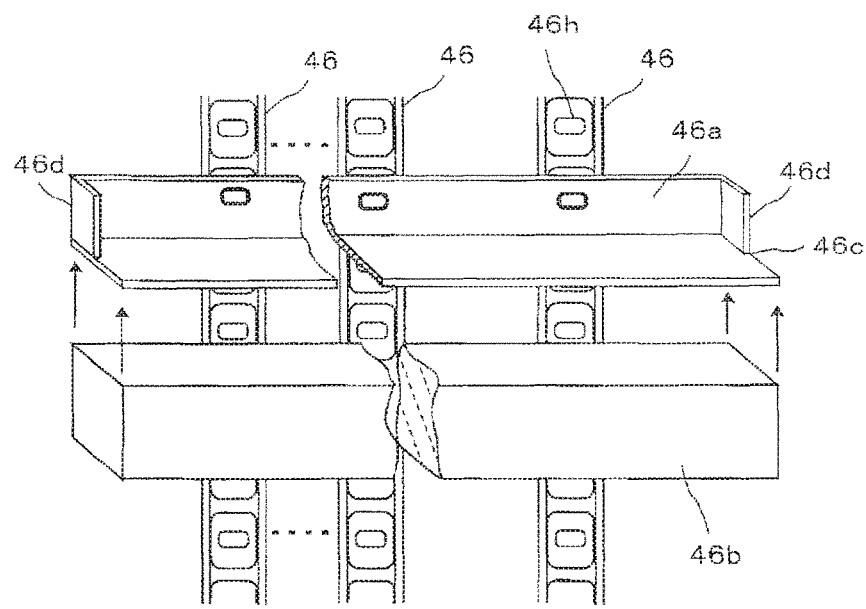
FIG. 12 is an explanatory diagram of a structure for attaching solar-string placing means and a shock absorbing member to an endless chain in the second embodiment of the container for solar string transportation according to the present invention.

FIG. 11 is a main part enlarged view of solar-string lifting/lowering means for explaining a second embodiment of the container for solar string transportation according to the present invention. FIG. 12 is an explanatory diagram of a structure for attaching solar-string placing means and a shock absorbing member shown in FIG. 11 to an endless chain. The solar-string placing means 46a, the shock absorbing member 46b, and the solar string 100 are shown in a partially cut state. Reference numerals and signs the same as those in FIG. 4 correspond to the same functional portions. In the first embodiment explained above, the solar-string placing means 46a and the shock absorbing member 46b attached to the chain member 46 are independently provided in each of the endless chain members 46. On the other hand, in the second embodiment, the solar-string placing means 46a and the shock absorbing member 46b are formed as long members common to the plurality of chain members 46 such that respective corresponding solar-string placing means of rows of the endless chain members 46 provided on the same side plate side of the container are common at the same height.

Figure 13:
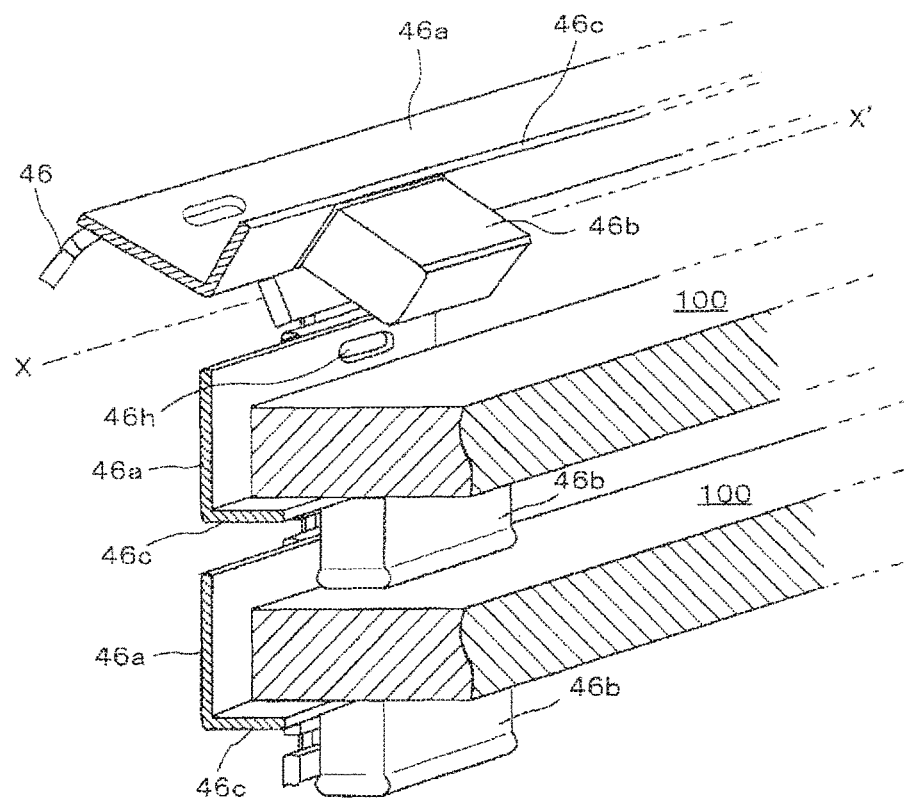
FIG. 13 is a main part enlarged view of solar-string lifting/lowering means for explaining a third embodiment of the container for solar string transportation according to the present invention.

The solar-string placing means 46a and the shock absorbing member 46b are attached to the endless chain member 46 as shown in FIG. 13. That is, the solar-string placing means 46a and the shock absorbing member 46b are attached to each of the same pair of endless chain members 46 at length for sufficiently covering a long direction size of the solar strings loaded in the container. The shock absorbing member 46b is fixed to the back of the projecting section 46c of the solar-string placing means 46a by an adhesive or the like. The solar-string placing means 46a is detachably fixed to a specific chain component element of the endless chain member 46 by means such as bolts and nuts.

Stoppers 46d provided at both ends of the solar-string placing means 46a shown in FIG. 12 are regulating members for the long direction end edges of the placed solar string 100. The stoppers 46d are not essential members.

As explained above, in the second embodiment, the driving shaft that transmits a driving force from the driving section 47 to the driving gear section 47a and the supporting shaft that supports the direction changing gear section 47b to rotate are respectively provided in common in the driving gear sections 47a and the direction changing gear sections 47b of the plurality of solar-string lifting/lowering means 45 set at a predetermined interval along the inner walls of the pair of long-side side plates 42a, 42b of the container 4.

That is, in the second embodiment, the solar-string placing means 46a is a single member obtained by bridging the solar-string placing means 46a of the plurality of solar-string lifting/lowering means 45 in common at the same height. The shock absorbing member 46b is also a single member obtained by bridging the solar-string placing means 46a of the plurality of solar-string lifting/lowering means 45 in common at the same height. The other components are the same as the components in the first embodiment. Therefore, repeated explanation of the components is omitted.

According to this embodiment, as in the first embodiment, it is possible to reduce a work period with a small number of workers and secure safety of work and obtain a container for solar string transportation for solar power plant construction that can be set at low costs.

Third Embodiment

FIG. 13 is a main part enlarged view of solar-string lifting/lowering means for explaining a third embodiment of the container for solar string transportation according to the present invention. The solar-string placing means 46a and the solar string 100 are shown in a partially cut state. In the third embodiment, the solar-string placing means 46a is a single member obtained by bridging the solar-string placing means 46a of the plurality of solar-string lifting/lowering means 45 in common at the same height. The shock absorbing member 46b is individually provided in each of the solar-string placing means 46a of the plurality of solar-string lifting/lowering means 45. The other components are the same as the components in the first embodiment and the second embodiment. Therefore, repeated explanation of the components is omitted.

According to this embodiment, as in the first and second embodiments, it is possible to reduce a work period with a small number of workers and secure safety of work and obtain a container for solar string transportation for solar power plant construction that can be set at low costs.

INDUSTRIAL APPLICABILITY

In the embodiments, the present invention is explained as the structure for handling the solar strings. However, the present invention can also be applied to handling of flat-shaped members similar to the solar strings.

REFERENCE SIGNS LIST 4 container for solar string transportation (dedicated container)
40 column body
41 bottom plate
42 long-side side plate
43 short-side side plate
44 lid
45 solar-string lifting/lowering means
46 endless chain
46a solar-string placing means
46b shock absorbing member
46c projecting section
46d stopper
46h gear hole
47 driving section
47a driving gear section
47b direction changing gear section
48 lifting/lowering-means-row moving/fixing means
49 rail
60 vacuum suction means (vacuum gripper)
8 heavy machine dedicated for power plant site construction (specially rigged heavy machine)
80 container transfer apparatus
9 crane dedicated for solar strings
90 arm
13 laser ranging means
100 solar string
110 solar module
111 bolt and nut
120 (120a, 120b) supporting frame

The invention claimed is:

1. A container for solar string transportation for transporting solar strings assembled as integrated components by fixing a plurality of solar modules to a supporting frame, the container including a solar-string storing section formed by a bottom plate formed in a rectangular shape in plan view, a pair of long-side side plates planted and attached at longitudinal side both end edges of the bottom plate, and a pair of short-side side plates planted and attached at lateral side both end edges of the bottom plate, an upper opening formed by the pair of long-side side plates and the pair of short-side side plates being formed as an opened section for loading and unloading of the solar strings, wherein on an inside of the solar-string storing section, rows of pairs of solar-string lifting/lowering means set along inner walls of the pair of long-side side plates and arrayed at a predetermined interval are provided, the solar-string lifting/lowering means includes a driving gear section driven by a driving section set on the bottom plate side, an endless chain member laid over to revolve around a direction changing gear section set on the upper opening side irreversibly and in synchronization with the rows of the pair of solar-string lifting/lowering means, a plurality of solar-string placing means fixed to the endless chain member at a predetermined interval and including, on an outer side of a track of the revolution, a projecting section for placing a lower surface of an end edge of the solar string, and a shock absorbing member fixed to a back of the solar-string placing means, the shock absorbing member pressing and holding an end edge upper surface of the solar string placed under the solar-string placing means, and during the loading and the unloading, the solar-string placing means located at a top of the solar-string lifting/lowering means and emptied without the solar string placed thereon and the shock absorbing member are controlled to move to retract to between the solar-string lifting/lowering means and the long-side side plate by the revolving movement of the chain member.

2. The container for solar string transportation according to claim 1, wherein a driving shaft that transmits a driving force from the driving section to the driving gear section and a supporting shaft that supports the direction changing gear sections to rotate are respectively provided in common in the driving gear sections and the direction changing gear sections of a plurality of the solar-string lifting/lowering means set at the predetermined interval along the inner walls of the pair of long-side side plates of the container.

3. The container for solar string transportation according to claim 2, wherein the solar-string placing means is a single member obtained by bridging the solar-string placing means of the plurality of solar-string lifting/lowering means in common at a same height.

4. The container for solar string transportation according to claim 2, wherein the shock absorbing member is a single member obtained by bridging the solar-string placing means of the plurality of solar-string lifting/lowering means in common at a same height.

5. The container for solar string transportation according to claim 2, wherein the solar-string placing means is a single member obtained by bridging the solar-string placing means, which form the rows of the plurality of solar-string lifting/lowering means, in common at a same height, and the shock absorbing member is individually provided in each of the solar-string placing means of the plurality of solar-string lifting/lowering means.

6. The container for solar string transportation according to claim 1, wherein the driving section of the solar-string lifting/lowering means uses an electric motor as a driving source.

7. The container for solar string transportation according to claim 1, wherein the driving section of the solar-string lifting/lowering means uses hydraulic pressure as a driving source.

8. The container for solar string transportation according to claim 1, wherein the driving section of the solar-string lifting/lowering means uses air pressure as a driving source.

9. The container for solar string transportation according to claim 1,
- wherein the container includes lifting/lowering-means-row moving/fixing means for changing and fixing, according to a size of the solar strings to be loaded, an interval between one row and the other row of the rows of the pair of solar-string lifting/lowering means set along the inner walls of the pair of long-side side plates.

10. The container for solar string transportation according to claim 9,
- wherein the lifting/lowering-means-row moving/fixing means is set to move only the one row of the rows of the pair of solar-string lifting/lowering means.

\* \* \* \* \*